(12) United States Patent
Chou et al.

(10) Patent No.: US 11,949,051 B2
(45) Date of Patent: Apr. 2, 2024

(54) WAVELENGTH CONVERSION MEMBER AND LIGHT SOURCE MODULE

(71) Applicant: DELTA ELECTRONICS, INC., Taoyuan (TW)

(72) Inventors: Yen-I Chou, Taoyuan (TW); Jih-Chi Li, Taoyuan (TW); Wen-Cheng Huang, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 104 days.

(21) Appl. No.: 17/156,653

(22) Filed: Jan. 25, 2021

(65) Prior Publication Data
US 2022/0059733 A1    Feb. 24, 2022

(30) Foreign Application Priority Data
Aug. 20, 2020   (CN) .......................... 202010843029.1

(51) Int. Cl.
*H01L 33/50*   (2010.01)

(52) U.S. Cl.
CPC .......... *H01L 33/505* (2013.01); *H01L 33/504* (2013.01); *H01L 2933/0041* (2013.01)

(58) Field of Classification Search
None
See application file for complete search history.

(56) References Cited

U.S. PATENT DOCUMENTS

| | | | | |
|---|---|---|---|---|
| 6,139,713 A * | 10/2000 | Masuda | ................. | C25D 11/16 205/213 |
| 10,001,261 B2 * | 6/2018 | Yagyu | ................. | H04N 9/3164 |
| 10,309,617 B2 * | 6/2019 | Chang | ................. | F21V 9/30 |
| 10,557,614 B2 | 2/2020 | Furuyama | | |
| 2013/0257264 A1 * | 10/2013 | Tamaki | ................. | H01L 33/502 313/503 |
| 2016/0348857 A1 * | 12/2016 | Miyata | ................. | F21V 9/38 |
| 2018/0003363 A1 | 1/2018 | Furuyama | | |
| 2019/0094671 A1 | 3/2019 | Ikeo | | |
| 2019/0146314 A1 * | 5/2019 | Yoshikawa | .......... | G03B 21/204 362/84 |
| 2020/0058830 A1 | 2/2020 | Furuyama | | |

FOREIGN PATENT DOCUMENTS

| | | |
|---|---|---|
| CN | 104614926 A | 5/2015 |
| CN | 107209302 A | 9/2017 |
| CN | 106199947 B | 11/2018 |
| CN | 109087985 A | 12/2018 |
| CN | 210323746 U | 4/2020 |
| DE | 19526917 A1 | 1/1997 |
| GB | 2306266 A | 4/1997 |
| TW | I616713 B | 3/2018 |
| TW | 201906195 A | 2/2019 |
| WO | 2016125611 A1 | 8/2016 |

OTHER PUBLICATIONS

Baumeister et al., "PCM-Based Energy Storage System with High Power Output Using Open Porous Aluminum Foams," 2020, Energies, 13, 6198, total pages 17 (Year: 2020).*

* cited by examiner

*Primary Examiner* — Bo B Jang
(74) *Attorney, Agent, or Firm* — CKC & Partners Co., LLC

(57) ABSTRACT

A wavelength conversion member includes a substrate, a phosphor layer, and a ventilated blade. The substrate is configured to rotate based on an axis. The phosphor layer is disposed on the substrate. The ventilated blade is disposed on the substrate and has a pore density between 10 ppi and 500 ppi or a volume porosity between 5% and 95%.

13 Claims, 9 Drawing Sheets

WAVELENGTH CONVERSION MEMBER AND LIGHT SOURCE MODULE

CROSS-REFERENCE TO RELATED APPLICATION

This application claims priority to China Application Serial Number, filed 202010843029.1, Aug. 20, 2020, which is herein incorporated by reference.

BACKGROUND

Technical Field

The present disclosure relates to a wavelength conversion member and a light source module.

Description of Related Art

In recent years, optical projectors have been used in many fields, and the scope of applications is also expanding day by day (e.g., from consumer products to high-tech equipment). Various optical projectors are also widely used in schools, homes and commercial occasions to enlarge the display pattern provided by the signal source and display it on the projection screen.

For the light source configuration of an optical projector, it can be emitting light from a fluorescent material driven by a solid-state laser light source. In this regard, the fluorescent material can be coated on a wheel, and a motor can be used to drive the wheel to rotate at a high speed, so that the laser light source energy received by the fluorescent material per unit time is reduced, thereby achieving the purpose of heat dissipation. However, as the brightness requirements for optical projectors continue to increase, the heat dissipation requirements for fluorescent materials have become increasingly stringent. Accordingly, how to have a better way of heat dissipation for the wheel and the fluorescent material thereon becomes an important issue to be solved by those in the industry.

SUMMARY

An aspect of the disclosure is to provide a wavelength conversion member and a light source module which can effectively solve the aforementioned problems.

According to an embodiment of the disclosure, a wavelength conversion member includes a substrate, a phosphor layer, and a ventilated blade. The substrate is configured to rotate based on an axis. The phosphor layer is disposed on the substrate. The ventilated blade is disposed on the substrate and has a pore density between 10 ppi and 500 ppi or a volume porosity between 5% and 95%.

In an embodiment of the disclosure, the phosphor layer and the ventilated blade are respectively located at opposite sides of the substrate.

In an embodiment of the disclosure, orthographic projections respectively of the phosphor layer and the ventilated blade and projected onto the substrate at least partially overlap.

In an embodiment of the disclosure, the phosphor layer and the ventilated blade are located at an identical side of the substrate.

In an embodiment of the disclosure, the wavelength conversion member further includes two of the ventilated blades. The ventilated blades are respectively located at opposite sides of the substrate.

In an embodiment of the disclosure, a material of the ventilated blade includes at least one of metal, ceramic, and glass.

In an embodiment of the disclosure, the substrate includes a metal material. The metal material includes at least one of Al, Ag, Cu, Fe, and Mo.

In an embodiment of the disclosure, the substrate includes a ceramic material. The ceramic material includes AlN, BN, SiC, or $Al_2O_3$.

In an embodiment of the disclosure, the substrate includes a semiconductor material. The semiconductor material includes Si, Ge, GaAs, InP, GaN, InAs, ZnSe, ZnS, or InSe.

In an embodiment of the disclosure, a material of the substrate includes glass, quartz, sapphire, or $CaF_2$.

According to an embodiment of the disclosure, a light source module includes a light source, the wavelength conversion member, and a driving unit. The light source is configured to emit light. The wavelength conversion member is configured to receive the light. The driving unit is engaged with the wavelength conversion member and configured to drive the wavelength conversion member to rotate based on the axis. The ventilated blade has an overall geometry. When the driving unit drives the substrate to rotate, the overall geometry generates turbulence, and through holes of the ventilated blade simultaneously produce micro vortexes.

According to an embodiment of the disclosure, a wavelength conversion member includes a substrate, a phosphor layer, and a non-ventilated blade. The substrate is configured to rotate based on an axis. The phosphor layer is disposed on the substrate. The non-ventilated blade has a roughness between 5 μm and 1.25 mm, or a specific surface area of the non-ventilated blade exceeds a geometric area of the non-ventilated blade by more than 10%.

Accordingly, in the wavelength conversion member of the present disclosure, a local area of the blade disposed on the substrate has a vortex generating function. In addition to the turbulence mechanism of the overall geometry of the blade, the blade material or mechanism design can produce the micro-vortex effect, thereby accelerating the air turbulence of the overall internal cavity of a projection device. Therefore, the size and weight of the blade can be greatly reduced, and the load power of the driving unit can be reduced. The blade can be a ventilated blade which can produce a vortex generation effect after the high-speed airflow flows through the through holes thereof. The blade can also be a non-ventilated blade with large roughness or large specific surface area, which can produce vortex generation effect after high-speed airflow hits the surface structure.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
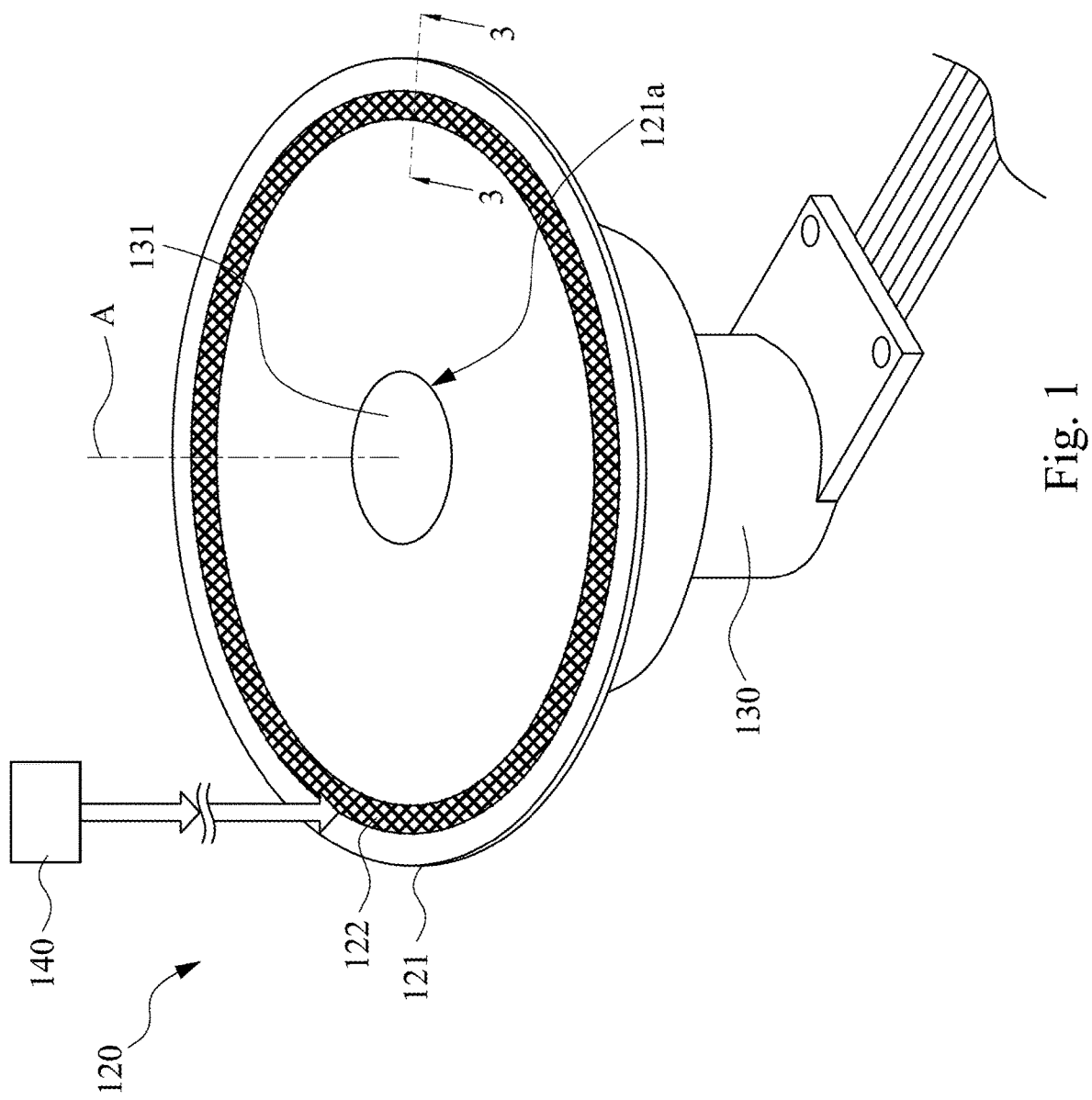
FIG. 1 is a perspective view of a light source module applied in a projection device.

Reference will now be made in detail to the present embodiments of the disclosure, examples of which are illustrated in the accompanying drawings. Wherever possible, the same reference numbers are used in the drawings and the description to refer to the same or like parts. However, specific structural and functional details disclosed herein are merely representative for purposes of describing example embodiments, and thus may be embodied in many alternate forms and should not be construed as limited to only example embodiments set forth herein. Therefore, it should be understood that there is no intent to limit example embodiments to the particular forms disclosed, but on the contrary, example embodiments are to cover all modifications, equivalents, and alternatives falling within the scope of the disclosure.

Reference is made to FIG. 1. FIG. 1 is a perspective view of a light source module applied in a projection device. The light source module includes a wavelength conversion member 120, a driving unit 130, and a light source 140. The wavelength conversion member 120 includes a substrate 121. The substrate 121 has a shaft hole 121*a*. The driving unit 130 is engaged with the wavelength conversion member 120 and configured to drive the wavelength conversion member 120 to rotate based on an axis A. Specifically, the driving unit 130 is, for example, a motor, and has a rotating shaft 131. The rotating shaft 131 is engaged with the inner edge of the shaft hole 121*a*. The central axis of the rotating shaft 131 is the axis A. By rotating the rotating shaft 131 of the motor, the wavelength conversion member 120 can be driven to rotate based on the axis A. The light source 140 is configured to emit light, and a light spot is formed and irradiated on the substrate 121 fixedly. In some embodiments, the light source 140 is a solid state laser light source, but the disclosure is not limited in this regard.

The wavelength conversion member 120 further includes a phosphor layer 122. The phosphor layer 122 is disposed on the substrate 121 and configured to receive the light emitted by the light source 140. Specifically, the light emitted by the light source 140 can reach the phosphor layer 122 through a specially designed light path (for example, a mirror, a beam splitter, etc.), and a light spot is generated on the phosphor layer 122. The phosphor layer 122 is substantially disposed on the substrate 121 along an annular path. Therefore, when the wavelength conversion member 120 rotates around the axis A, the light spot generated by the light source 140 can continuously irradiate the phosphor layer 122.

Figure 2:
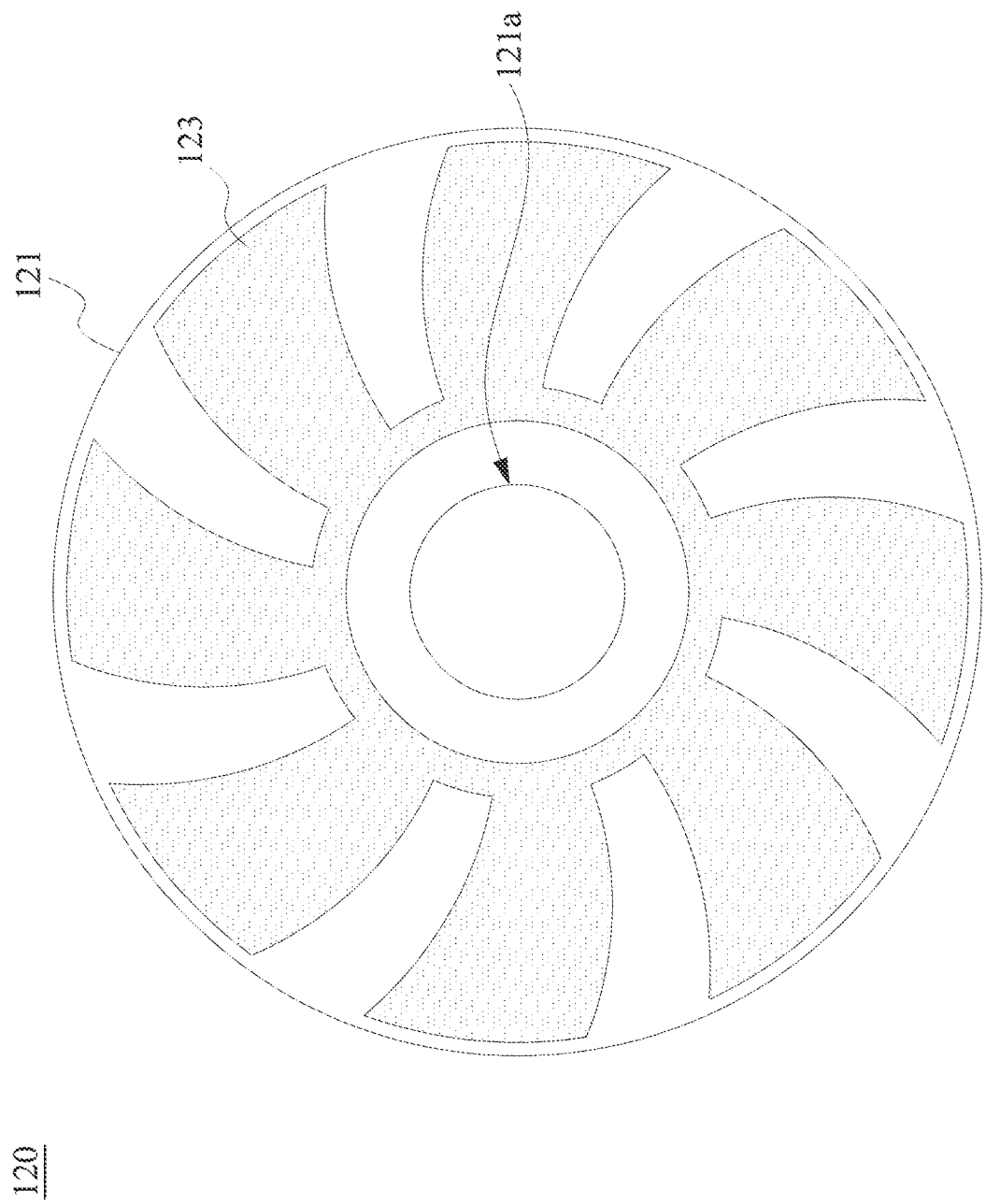
FIG. 2 is a bottom view of a wavelength conversion member in FIG. 1.
Figure 3:
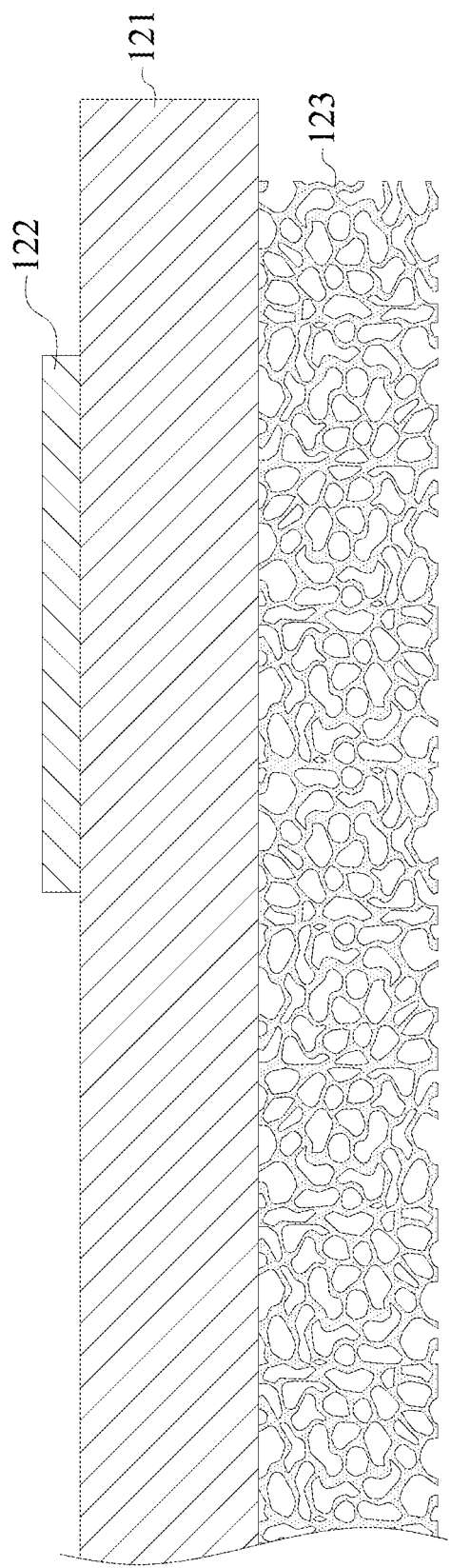
FIG. 3 is a cross-sectional view of the wavelength conversion member in FIG. 1 taken along line 3-3.

Reference is made to FIGS. 2 and 3. FIG. 2 is a bottom view of the wavelength conversion member 120 in FIG. 1. FIG. 3 is a cross-sectional view of the wavelength conversion member 120 in FIG. 1 taken along line 3-3. As shown in FIGS. 2 and 3, in the present embodiment, the wavelength conversion member 120 further includes a ventilated blade 123. The ventilated blade 123 is tightly attached to the substrate 121 and has a pore density between 10 ppi and 500 ppi or a volume porosity between 5% and 95%. It should be noted that the aforementioned "tightly attached" should not exclude the presence of an intermediate substance between the ventilated blade 123 and the substrate 121, such as the presence of a thermal interface, a fixing member, or an adhesive. The intermediate substance is mainly used to fix the ventilated blade 123 on the substrate 121, so as to transfer the heat from the substrate 121 and move along with the substrate 121.

In some embodiments, a material of the ventilated blade 123 includes at least one of metal, ceramic, and glass. For example, the ventilated blade 123 may be a foamed metal structure with through holes (for example, foamed copper), or a wound-like metal wire structure (for example, copper wire or steel wire), but the present disclosure is not limited in this regard.

With the foregoing structural configurations, the ventilated blade 123 itself is a good thermally conductive material for conducting the heat transferred from the phosphor layer 122 to the substrate 121. On the other hand, when the substrate 121 is driven by the motor, a local area of the ventilated blade 123 has a vortex generating function. Furthermore, in addition to the turbulence mechanism of the overall geometry of the ventilated blade 123, the through holes of the ventilated blade 123 can produce the micro-vortex effect (micro vortexes flow through the through holes with high-speed airflow when the substrate 121 rotates), and these micro vortexes can further accelerate the air turbulence of the overall internal cavity of the projection device. Moreover, the size and weight of the ventilated blade 123 can be greatly reduced, and the load power of the driving unit 130 can be reduced. It should be noted that the overall geometric shape of the ventilated blade 123 may be cut, arranged, or pieced together to form a blade shape or a non-blade shape, such as a plurality of strips arranged in a scattering-shaped manner.

In some embodiments, the substrate 121 which is reflective and opaque includes a metal material. The metal material includes, for example, Al, Ag, Cu, Fe, Mo, or combinations thereof, but the present disclosure is not limited in this regard.

In some embodiments, the substrate 121 which is reflective and opaque includes a ceramic material. The ceramic material includes, for example, AlN, BN, SiC, or $Al_2O_3$, but the present disclosure is not limited in this regard.

In some embodiments, the substrate 121 which is reflective and opaque includes a semiconductor material. The semiconductor material includes, for example, a unit semiconductor material (e.g., Si, Ge), a binary semiconductor material (e.g., GaAs, InP, GaN, InAs, ZnSe, ZnS, InSe, etc.), or other series of materials such as multiple compound semiconductors of binary or higher, but the present disclosure is not limited in this regard.

In some embodiments, a material of the substrate 121 which is transparent includes glass, quartz, sapphire, or $CaF_2$, but the present disclosure is not limited in this regard.

In some embodiments, a thickness of the ventilated blade 123 is from about 0.5 mm to about 50 mm, but the present disclosure is not limited in this regard.

In some embodiments, a material of the phosphor layer 122 includes aluminate (YAG), silicate, nitride, or quantum dots, but the present disclosure is not limited in this regard.

In some embodiments, a material of a binder used in the phosphor layer 122 can be an organic material or an inorganic material, in which the organic material is, for example, silicone, epoxy resin, etc., and the inorganic material is, for example, alumina, aluminum nitride, etc., but the present disclosure is not limited in this regard.

In some embodiments, the ventilated blade 123 is fixed to the substrate 121 in a mechanical manner (e.g., by screwing or structural engagement). In some embodiments, the ventilated blade 123 is fixed to the substrate 121 via an adhesive material (e.g., heat dissipation paste).

Figure 4:
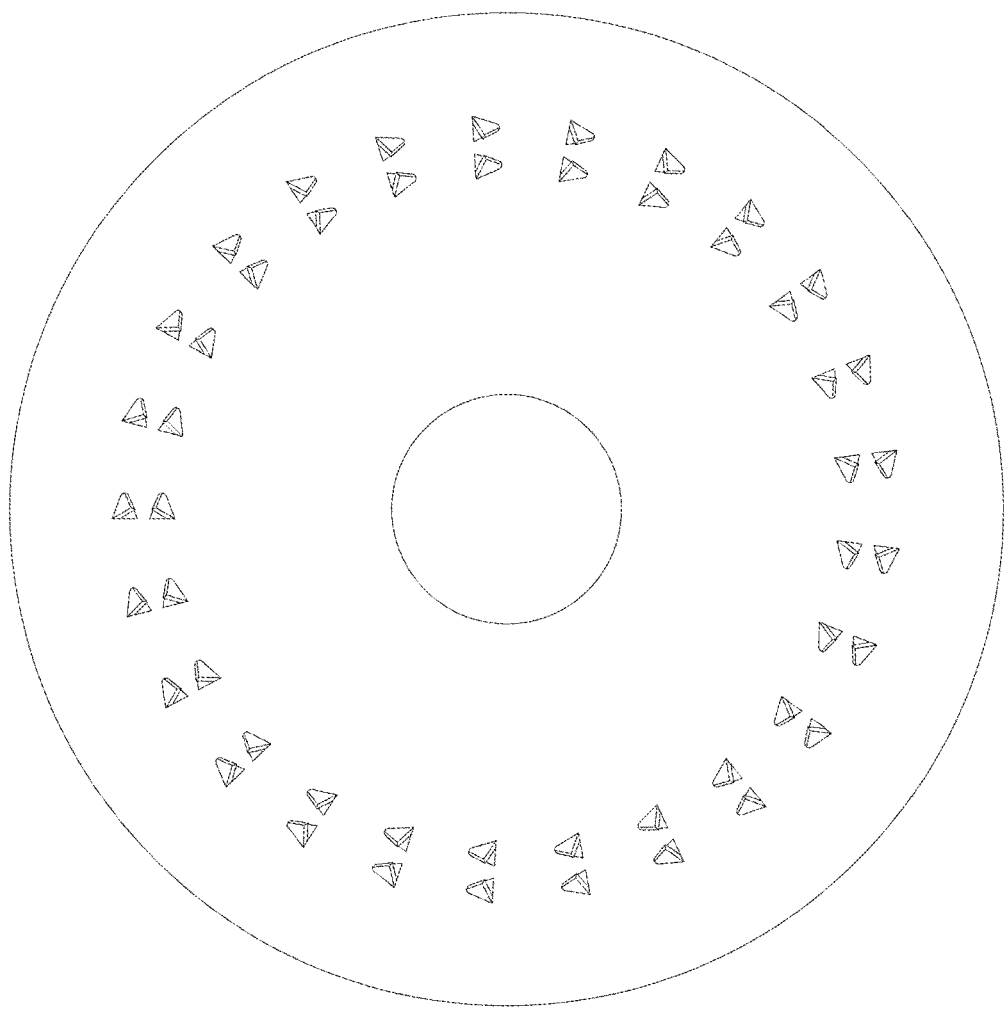
FIG. 4 is a bottom view of a conventional wavelength conversion member.
Figure 5:
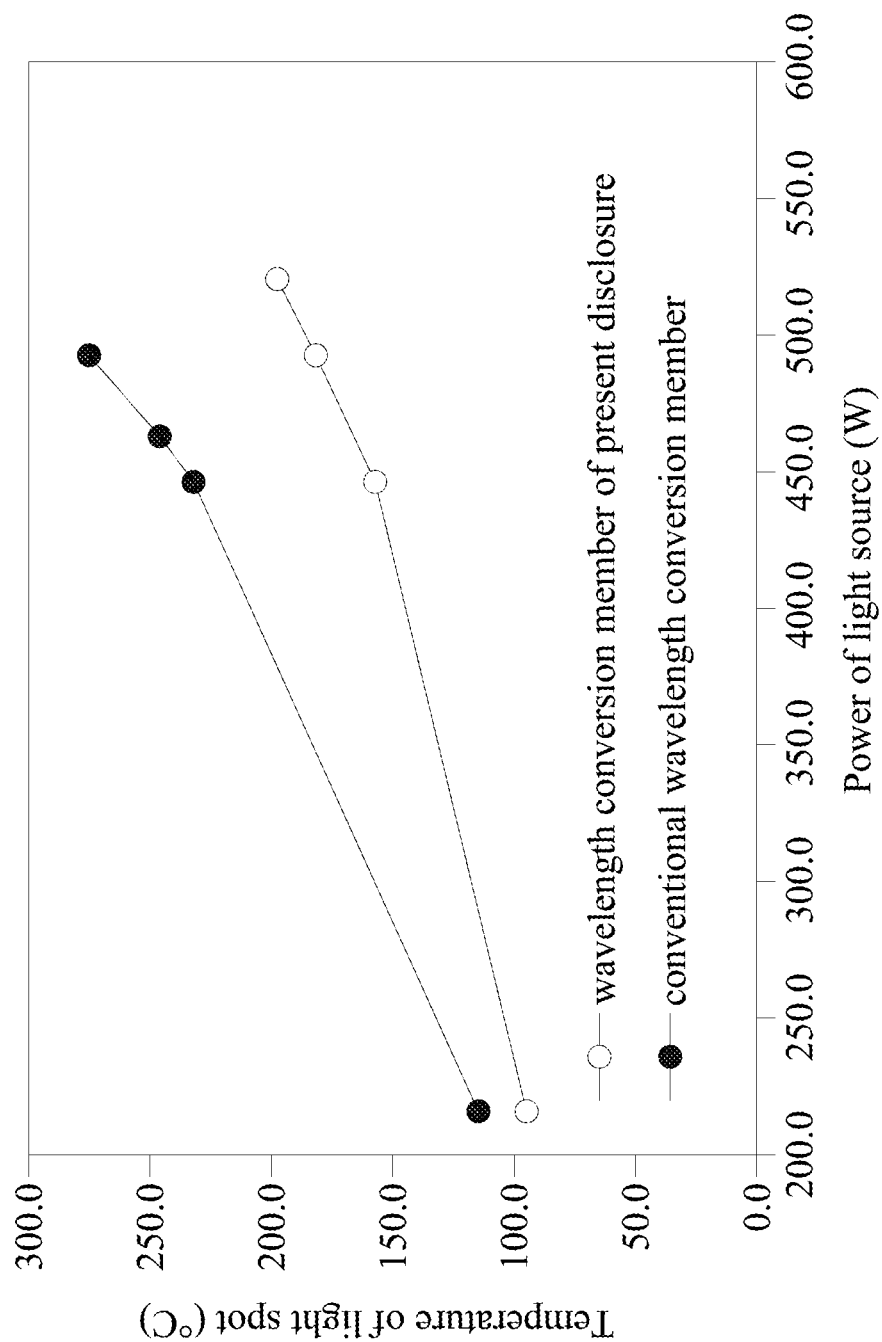
FIG. 5 is a graph showing curves of power of light source power vs. temperature of light spot of the wavelength conversion member of the present disclosure and the conventional wavelength conversion member.
Figure 6:
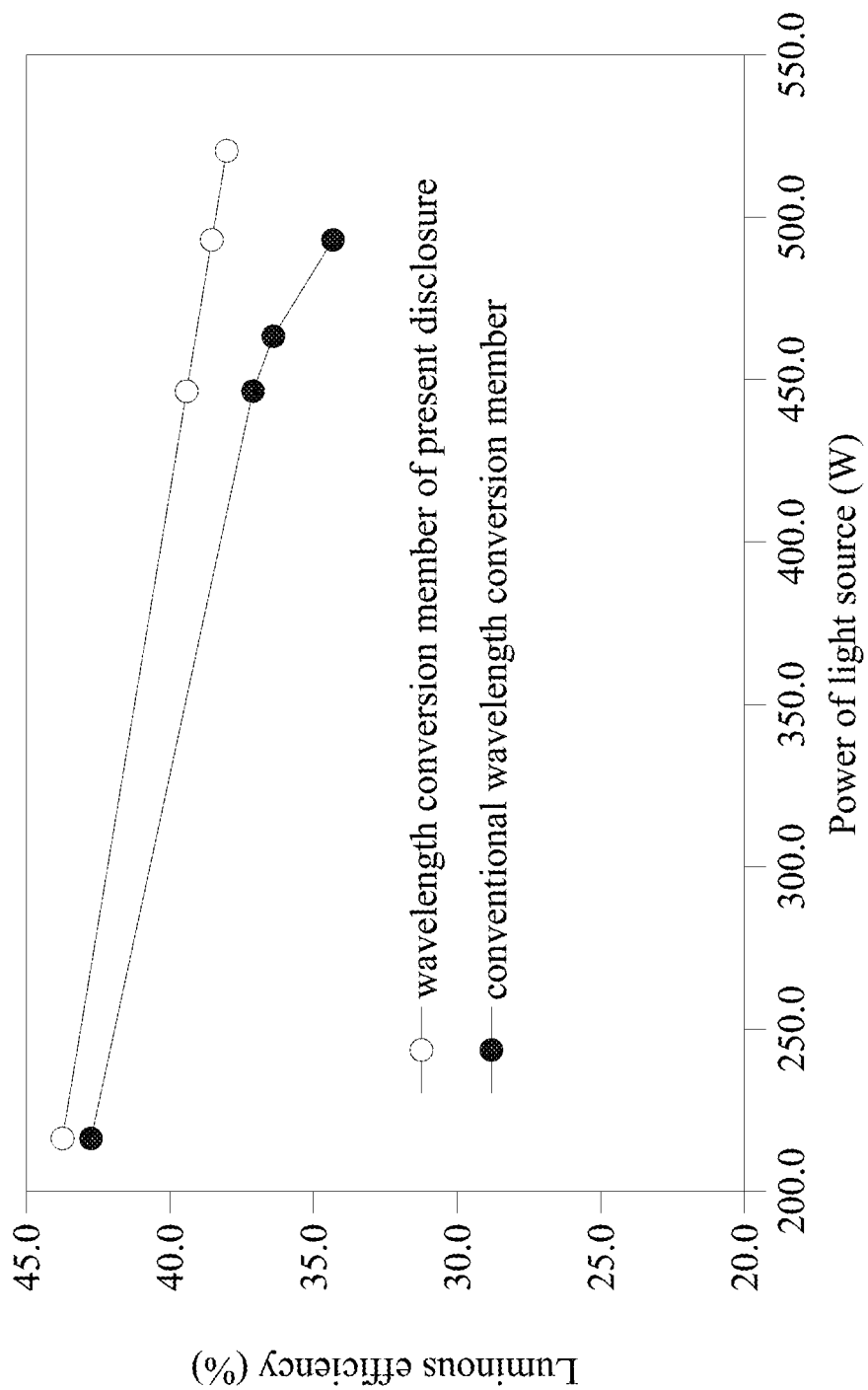
FIG. 6 is a graph showing curves of power of light source power vs. luminous efficiency of the wavelength conversion member of the present disclosure and the conventional wavelength conversion member.

Reference is made to FIGS. 4 to 6. FIG. 4 is a bottom view of a conventional wavelength conversion member 900. FIG. 5 is a graph showing curves of power of light source power vs. temperature of light spot of the wavelength conversion member 120 of the present disclosure and the conventional wavelength conversion member 900. FIG. 6 is a graph showing curves of power of light source power vs. luminous efficiency of the wavelength conversion member 120 of the present disclosure and the conventional wavelength conversion member 900. As shown in FIG. 4, the substrate of the conventional wavelength conversion member 900 has a plurality of arrow-shaped holes. In FIGS. 5 and 6, for comparison with the conventional wavelength conversion member 900, the ventilated blade 123 of the wavelength conversion member 120 used in the present disclosure has a pore density of about 95 ppi and a thickness of about 2 mm. Furthermore, the curves in FIGS. 5 and 6 are measured from the wavelength conversion member 120 of the present disclosure and the conventional wavelength conversion member 900 at the same rotation speed of 5000 rpm.

It can be clearly seen from FIG. 5 that the temperature measured at the light spot of the wavelength conversion member 120 of the present disclosure is at least 50° C. lower than that of the conventional wavelength conversion member 900. Therefore, it is possible to effectively avoid the phenomenon of heat decay of the phosphor layer 122 due to high temperature. In addition, it can be clearly seen from FIG. 6 that for the wavelength conversion member 120 of the present disclosure, the luminous efficiency of the phosphor layer 122 does not deteriorate drastically as the power of the light source increases (that is, there is no heat decay phenomenon). Therefore, for the projection device using the wavelength conversion member 120 of the present disclosure, the maximum operating power of the light source 140 can be effectively increased.

As shown in FIG. 3, the phosphor layer 122 and the ventilated blade 123 are respectively located at opposite sides of the substrate 121, and preferably orthographic projections respectively of the phosphor layer 122 and the ventilated blade 123 and projected onto the substrate 121 at least partially overlap, but the present disclosure is not limited in this regard.

Figure 7:
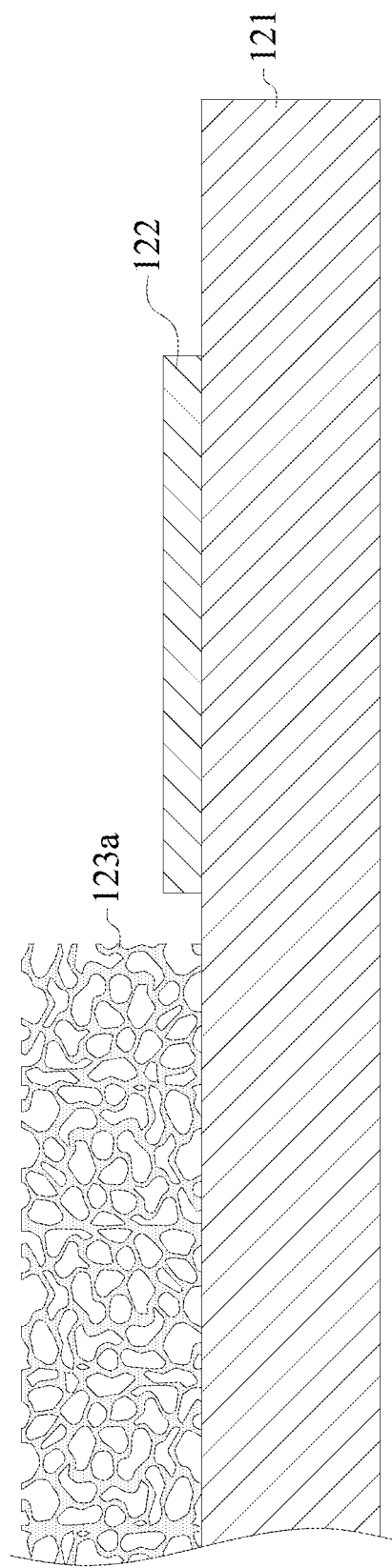
FIG. 7 is a cross-sectional view of a wavelength conversion member according to another embodiment of the present disclosure.

Reference is made to FIG. 7. FIG. 7 is a cross-sectional view of a wavelength conversion member 120A according to another embodiment of the present disclosure. In the present embodiment, the phosphor layer 122 and a ventilated blade 123a are located at an identical side of the substrate 121. The ventilated blade 123a can also use the high-speed airflow to flow through the through holes to produce the micro-vortex effect when the wavelength conversion member 120A rotates.

Figure 8:
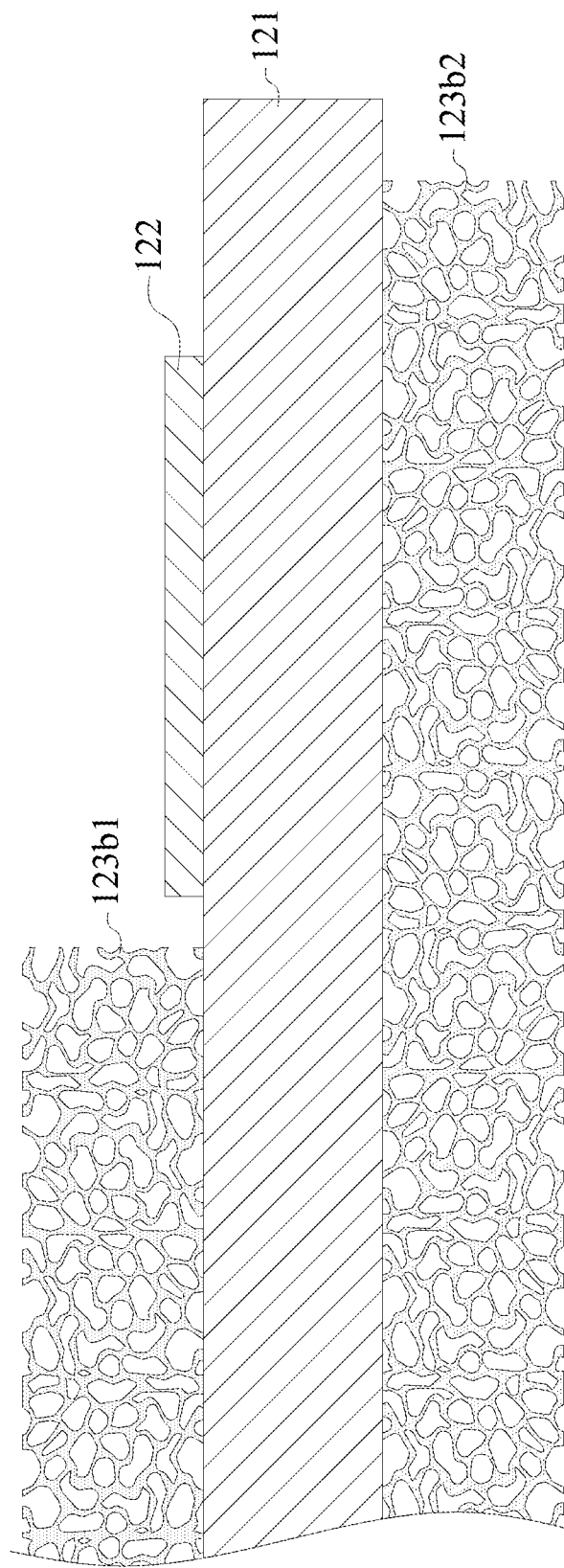
FIG. 8 is a cross-sectional view of a wavelength conversion member according to another embodiment of the present disclosure.

Reference is made to FIG. 8. FIG. 8 is a cross-sectional view of a wavelength conversion member 120B according to another embodiment of the present disclosure. In the present embodiment, the wavelength conversion member 120B includes two ventilated blades 123$b$1, 123$b$2. The ventilated blades 123$b$1, 123$b$2 are respectively located at opposite sides of the substrate 121, in which the ventilated blade 123$b$1 and the phosphor layer 122 are located at the same side of the substrate 121, and the ventilated blade 123$b$2 is located at the other side of the substrate 121. The ventilated blades 123$b$1, 123$b$2 can use the high-speed airflow to flow through the through holes to produce the micro-vortex effect at both sides of the substrate 121 when the wavelength conversion member 120B rotates.

Figure 9:
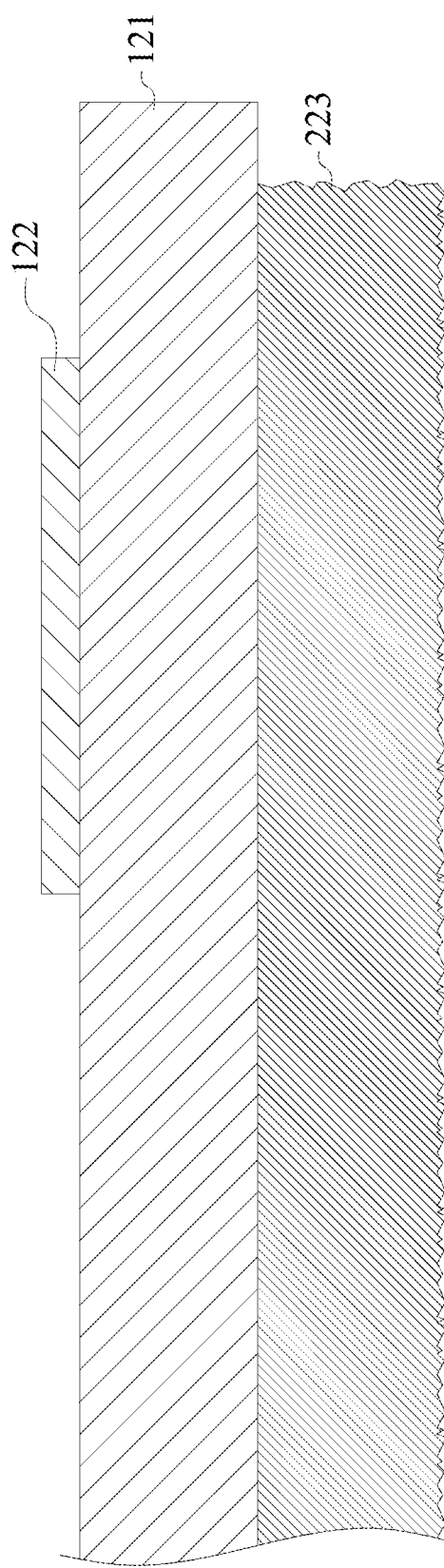
FIG. 9 is a cross-sectional view of a wavelength conversion member according to another embodiment of the present disclosure.

Reference is made to FIG. 9. FIG. 9 is a cross-sectional view of a wavelength conversion member 220 according to another embodiment of the present disclosure. In the present embodiment, the wavelength conversion member 220 includes a substrate 121, a phosphor layer 122, and a non-ventilated blade 223, in which the substrate 121 and the phosphor layer 122 are the same as or similar to those of the embodiment shown in FIG. 3, and therefore, reference may be made to the related descriptions above and will not be repeated here. Specifically, the wavelength conversion member 220 of the present embodiment is obtained by replacing the ventilated blade 123 shown in FIG. 3 with the non-ventilated blade 223. The non-ventilated blade 223 has a roughness between 5 μm and 1.25 mm, or a specific surface area of the non-ventilated blade 223 exceeds a geometric area of the non-ventilated blade 223 by more than 10%. The aforementioned specific surface area refers to the total surface area of the non-ventilated blade 223 per unit mass. The specific surface area can be measured by low-temperature nitrogen adsorption method or static volumetric method (static volumetric principle-V-Sorb 2800), but the present disclosure is not limited in this regard. The aforementioned geometric area refers to the total area of the non-ventilated blade 223 regardless of roughness. The geometric area can be obtained by summing orthographic projection areas of all surfaces of the non-ventilated blade 223.

With the foregoing structural configurations, a local area of the non-ventilated blade 223 can also have the vortex generating function. In addition to the turbulence mechanism of the overall geometry of the non-ventilated blade 223, the non-ventilated blade 223 with large roughness can further produce the micro-vortex effect (by hitting rough surfaces by high-speed airflow), thereby accelerating the air turbulence of the overall internal cavity of a projection device.

The blade shape, the material, and the position of the non-ventilated blade 223 relative to the substrate 121 may be the same as or similar to those of any of the ventilated blades 123, 123a, 123$b$1, 123$b$2 shown in FIGS. 2, 3, 7, and 8 and will not be repeated here.

According to the foregoing recitations of the embodiments of the disclosure, it can be seen that in the wavelength conversion member of the present disclosure, a local area of the blade disposed on the substrate has a vortex generating function. In addition to the turbulence mechanism of the overall geometry of the blade, the blade material or mechanism design can produce the micro-vortex effect, thereby accelerating the air turbulence of the overall internal cavity of a projection device. Therefore, the size and weight of the blade can be greatly reduced, and the load power of the driving unit can be reduced. The blade can be a ventilated blade which can produce a vortex generation effect after the high-speed airflow flows through the through holes thereof. The blade can also be a non-ventilated blade with large roughness or large specific surface area, which can produce vortex generation effect after high-speed airflow hits the surface structure.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A wavelength conversion member, comprising:
a substrate configured to rotate based on an axis;
a phosphor layer disposed on the substrate; and
a ventilated blade disposed on the substrate and having a pore density between 10 ppi and 500 ppi or a volume porosity between 5% and 95%, wherein the ventilated blade is a foamed metal structure with tortuous through holes or a wound-like metal wire structure, and wherein the tortuous through holes of the ventilated blade are configured to allow airflow to flow through when the substrate rotates, so as to produce micro vortexes.

2. The wavelength conversion member of claim 1, wherein the phosphor layer and the ventilated blade are respectively located at opposite sides of the substrate.

3. The wavelength conversion member of claim 2, wherein orthographic projections respectively of the phosphor layer and the ventilated blade projected onto the substrate at least partially overlap.

4. The wavelength conversion member of claim 1, wherein the phosphor layer and the ventilated blade are located at an identical side of the substrate.

5. The wavelength conversion member of claim 1, further comprising another ventilated blade, wherein the ventilated blade and the another ventilated blade are respectively located at opposite sides of the substrate.

6. The wavelength conversion member of claim 1, wherein a material of the ventilated blade comprises at least one of metal, ceramic, and glass.

7. The wavelength conversion member of claim 1, wherein the substrate comprises a metal material, and the metal material comprises at least one of Al, Ag, Cu, Fe, and Mo.

8. The wavelength conversion member of claim 1, wherein the substrate comprises a ceramic material, and the ceramic material comprises AlN, BN, SiC, or $Al_2O_3$.

9. The wavelength conversion member of claim 1, wherein the substrate comprises a semiconductor material, and the semiconductor material comprises Si, Ge, GaAs, InP, GaN, InAs, ZnSe, ZnS, or InSe.

10. The wavelength conversion member of claim 1, wherein a material of the substrate comprises glass, quartz, sapphire, or $CaF_2$.

11. A light source module, comprising:
a light source configured to emit light;
the wavelength conversion member of claim 1 configured to receive the light; and
a driving unit engaged with the wavelength conversion member and configured to drive the wavelength conversion member to rotate based on the axis,
wherein when the driving unit drives the substrate to rotate, the ventilated blade generates turbulence, and the tortuous through holes of the ventilated blade simultaneously produce the micro vortexes.

12. A wavelength conversion member, comprising:
a substrate configured to rotate based on an axis;
a phosphor layer disposed on the substrate; and
a ventilated blade disposed on the substrate and having a pore density between 10 ppi and 500 ppi or a volume porosity between 5% and 95%, wherein the phosphor layer and the ventilated blade are located at an identical side of the substrate and spaced apart from each other.

13. A wavelength conversion member, comprising:
a substrate configured to rotate based on an axis;
a phosphor layer disposed on the substrate; and
a ventilated blade disposed on the substrate and having a pore density between 10 ppi and 500 ppi or a volume porosity between 5% and 95%, wherein the ventilated blade comprises a plurality of blade portions extending radially relative to the axis.

* * * * *